(12) United States Patent
Miura

(10) Patent No.: US 7,687,873 B2
(45) Date of Patent: Mar. 30, 2010

(54) PHOTODIODE AND PHOTO INTEGRATED CIRCUIT HAVING THE SAME

(75) Inventor: Noriyuki Miura, Kanagawa (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 234 days.

(21) Appl. No.: 11/983,603

(22) Filed: Nov. 9, 2007

(65) Prior Publication Data
US 2008/0135898 A1      Jun. 12, 2008

(30) Foreign Application Priority Data
Nov. 14, 2006   (JP)   ............... 2006-308381

(51) Int. Cl.
*H01L 33/00*   (2006.01)
(52) U.S. Cl. ............... 257/457; 257/E33.077
(58) Field of Classification Search ........ 257/292, 257/457, 458, E33.076, E33.077
See application file for complete search history.

(56) References Cited

U.S. PATENT DOCUMENTS

| | | | |
|---|---|---|---|
| 4,972,252 A | | 11/1990 | Mackawa |
| 5,525,828 A | * | 6/1996 | Bassous et al. ............ 257/457 |
| 2002/0027239 A1 | | 3/2002 | Ohkubo |

FOREIGN PATENT DOCUMENTS

| | | |
|---|---|---|
| JP | 64-2377 | 1/1986 |
| JP | 64002377 | 1/1989 |
| JP | 7-162024 | 6/1995 |
| JP | 7162024 | 6/1995 |
| JP | 2001-320075 | 11/2001 |
| JP | 2001320075 | 11/2001 |
| JP | 2002083949 | 3/2002 |

* cited by examiner

*Primary Examiner*—Thomas L Dickey
(74) *Attorney, Agent, or Firm*—Taft Stettinius & Hollister LLP

(57) ABSTRACT

A photodiode comprises a support substrate, an insulating layer formed over the support substrate, a silicon semiconductor layer formed over the insulating layer and having a device forming area and device isolation areas which surround the device forming area, a device isolation layer formed in the device isolation areas, a P+ diffusion layer formed in the device forming area close to one edge lying inside the device isolation layer by diffusing a P-type impurity in a high concentration, an N+ diffusion layer spaced away from the P+ diffusion layer and formed in the device forming area close to the other edge opposite to the one edge of the device isolation layer by diffusing an N-type impurity in a high concentration, a low concentration diffusion layer formed in the device forming area located between the P+ diffusion layer and the N+ diffusion layer by diffusing an impurity of the same type as either one of the P+ diffusion layer and the N+ diffusion layer in a low concentration, and silicide layers respectively formed above the P+ diffusion layer and the N+ diffusion layer with being spaced away from a boundary between the low concentration diffusion layer and the P+ diffusion layer and a boundary between the low concentration diffusion layer and the N+ diffusion layer.

22 Claims, 12 Drawing Sheets

PHOTODIODE AND PHOTO INTEGRATED CIRCUIT HAVING THE SAME

CROSS-REFERENCE TO RELATED APPLICATIONS

This application is a claims priority under 35 U.S.C. §119 to Japanese Patent Application Serial No. JP2006-308381 filed on Nov. 14, 2006, entitled "Photodiode and Photo IC having the same," the disclosure of which is hereby incorporated by reference.

FIELD OF THE INVENTION

The present invention relates to a photodiode that generates current in response to light, particularly, ultraviolet light, and a photo integrated circuit (IC) equipped with the same.

INTRODUCTION TO THE INVENTION

The present invention provides, in part, a photodiode comprising a support substrate, an insulating layer formed over the support substrate, a silicon semiconductor layer formed over the insulating layer and having a device forming area and device isolation areas which surround the device forming area, a device isolation layer formed in the device isolation areas, a P-type high-concentration diffusion layer formed in the device forming area close to one edge lying inside the device isolation layer by diffusing a P-type impurity in a high concentration, an N-type high-concentration diffusion layer spaced away from the P-type high-concentration diffusion layer and formed in the device forming area close to the other edge opposite to the one edge of the device isolation layer by diffusing an N-type impurity in a high concentration, a low concentration diffusion layer formed in the device forming area located between the P-type high-concentration diffusion layer and the N-type high-concentration diffusion layer by diffusing an impurity of the same type as either one of the P-type high-concentration diffusion layer and the N-type high-concentration diffusion layer in a low concentration, and silicide layers respectively formed above the P-type high-concentration diffusion layer and the N-type high-concentration diffusion layer being spaced away from a boundary between the low concentration diffusion layer and the P-type high-concentration diffusion layer and a boundary between the low concentration diffusion layer and the N-type high-concentration diffusion layer.

The present invention brings about advantageous effects in that non-silicide portions can easily be formed with the sides of the boundaries with the low concentration diffusion layer not brought into contact with the device isolation layer at the peripheral edges of the P-type high-concentration diffusion layer and the N-type high-concentration diffusion layer being spaced away from the low concentration diffusion layer, and silicide layers are prevented from covering the low concentration diffusion layer, thus making it possible to stabilize the quality of a photodiode.

DETAILED DESCRIPTION

Figure 1:
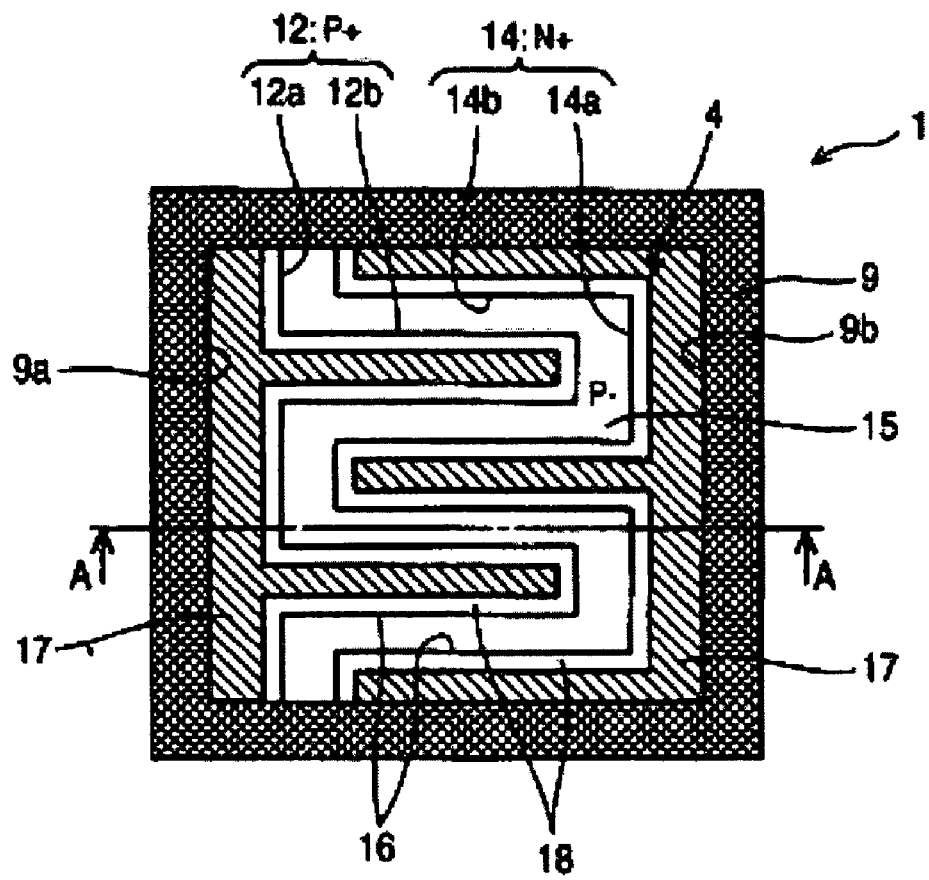
FIG. 1 is a plan view of an upper surface of a photodiode according to a first exemplary embodiment.

The exemplary embodiments of the present invention are described and illustrated below to encompass methods of fabricating photodiodes that generates current in response to light, particularly, ultraviolet light, as well as photo integrated circuits that include photodiodes. Of course, it will be apparent to those of ordinary skill in the art that the preferred embodiments discussed below are exemplary in nature and may be reconfigured without departing from the scope and spirit of the present invention. However, for clarity and precision, the exemplary embodiments as discussed below may include optional steps, methods, and features that one of ordinary skill should recognize as not being a requisite to fall within the scope of the present invention. Moreover, the exemplary description may utilize the same reference numerals and symbols appearing in the drawings across multiple embodiments to refer to the same structural components.

Figure 2:
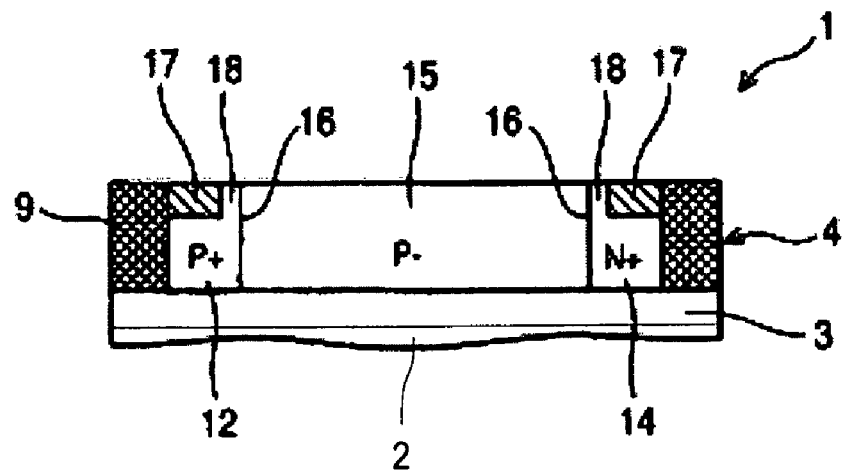
FIG. 2 is a sectional view taken along line A-A of FIG. 1.

Referencing FIGS. 1 and 2, a first exemplary embodiment comprises a photodiode 1. This photodiode 1 comprises an optical sensor or photosensor that is formed in a silicon semiconductor layer 4 of a semiconductor wafer having a silicon-on-insulator (SOI) structure. The exemplary SOI structure includes a silicon semiconductor layer 4 comprising a thin monocrystalline silicon layer formed on a silicon substrate 2 having an buried oxide film (BOX) 3. In this exemplary embodiment, the oxide film is silicon oxide ($SiO_2$) and this silicon oxide film interposes the silicon semiconductor layer 4 and the silicon substrate. The photodiode of the first exemplary embodiment has sensitivity only in an ultraviolet region with a wavelength of generally 400 nm or less.

Figure 3:
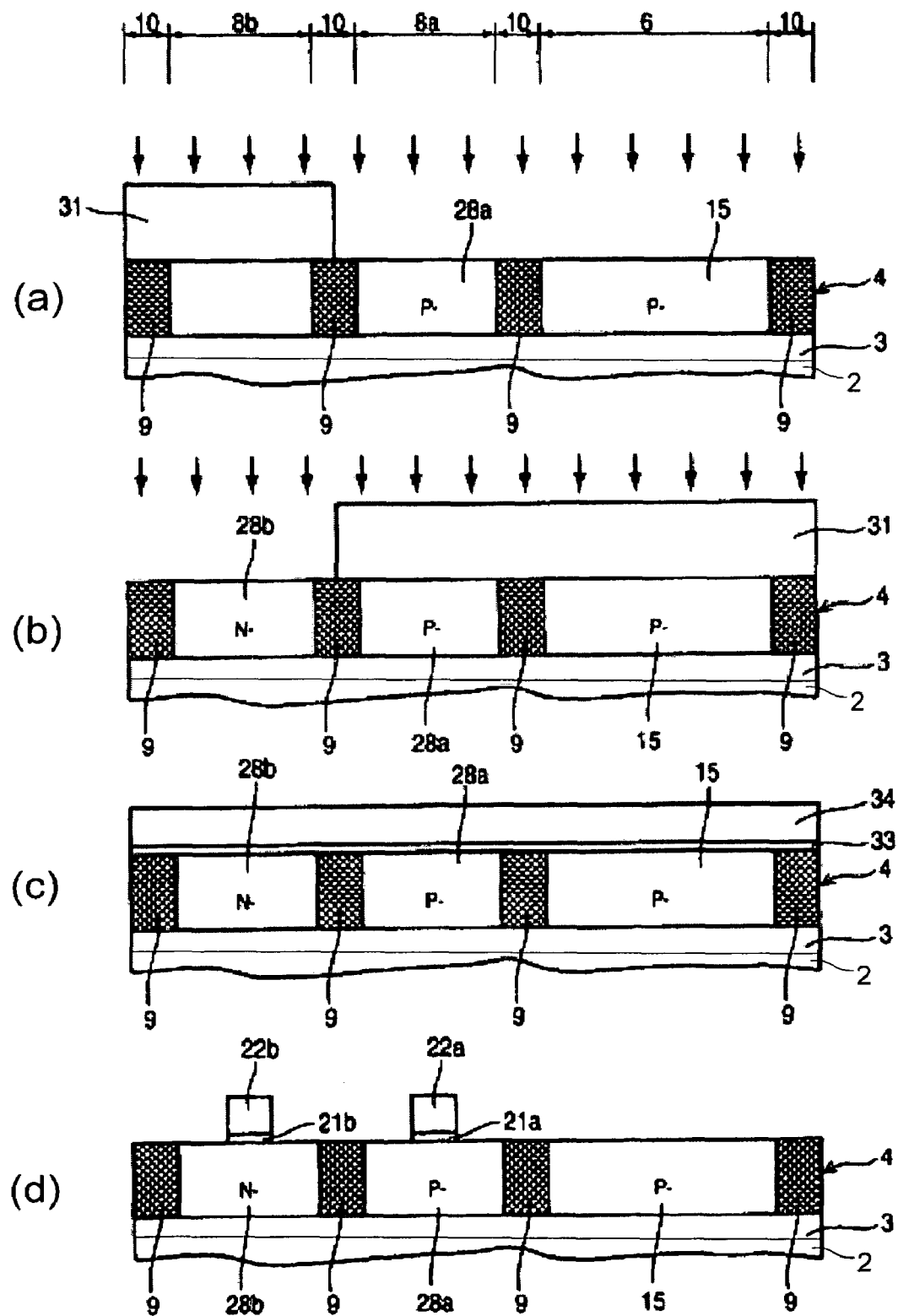
FIG. 3 is a cross-section of a segment of a photo integrated circuit in accordance with the first exemplary embodiment.
Figure 4:
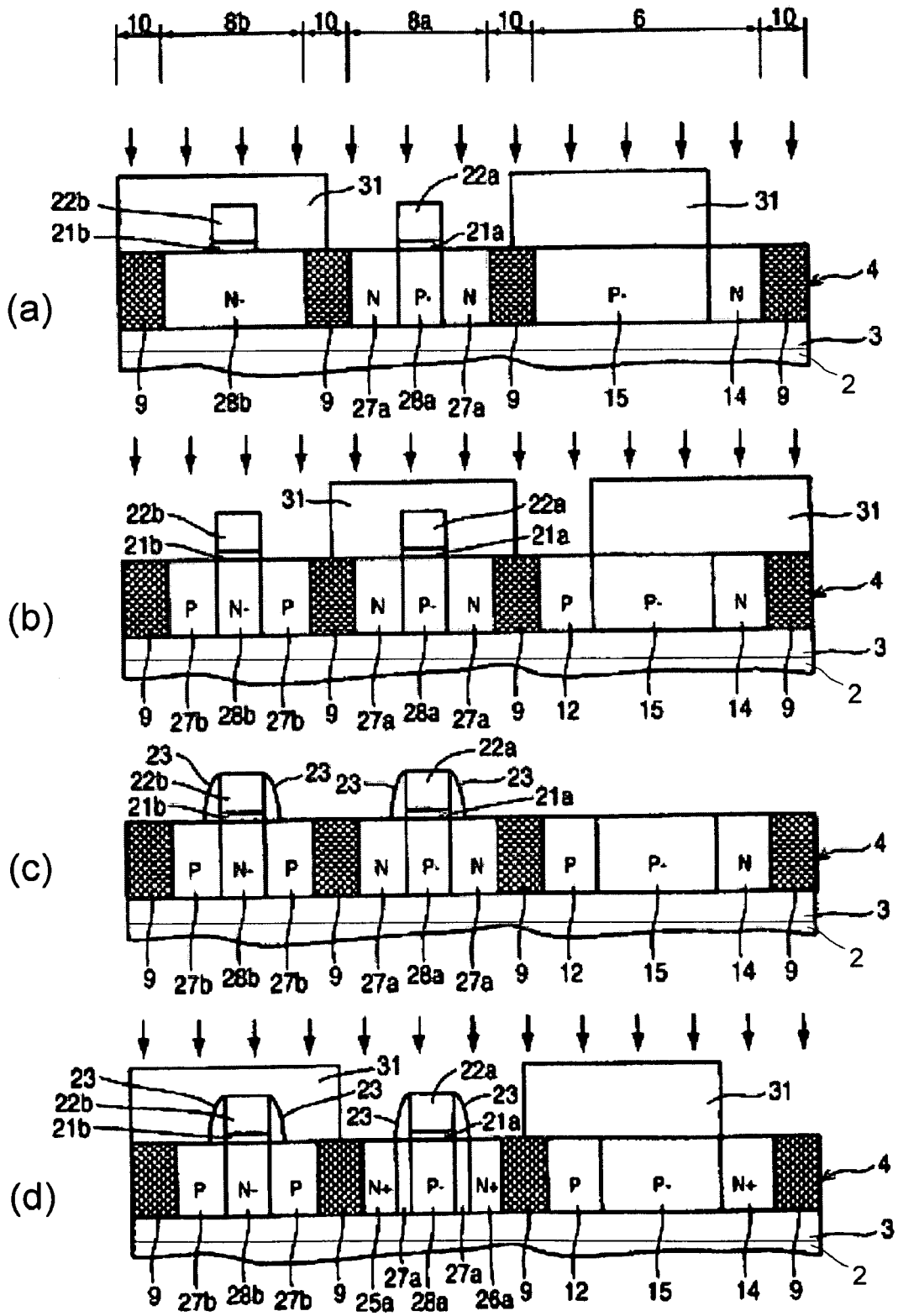
FIG. 4 is a sequential series of cross-sections of integrated circuit segments after completion of certain processing steps in accordance with fabricating a photo integrated circuit of the first exemplary embodiment.
Figure 5:
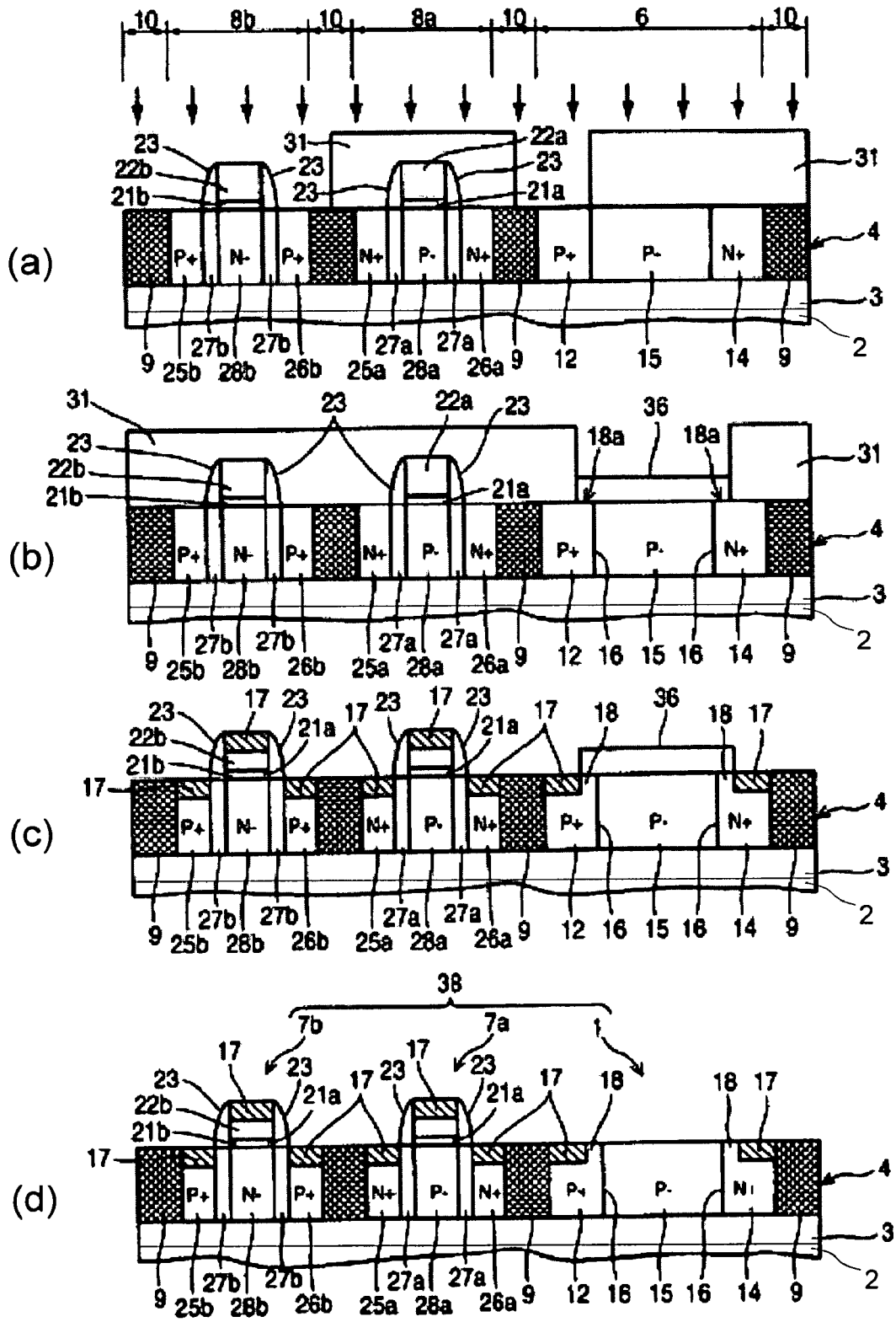
FIG. 5 is a sequential series of cross-sections of integrated circuit segments, after exhausting the processing steps of FIG. 4, after completion of certain processing steps in accordance with fabricating a photo integrated circuit of the first exemplary embodiment.

Referring to FIGS. 3-5, a diode forming area 6 is used as a device forming area for forming the photodiode 1, and transistor forming areas 8a and 8b are used as device forming areas for forming an nMOS element 7a and a pMOS element 7*b* (see FIG. 5 (*d*)) each defined as MOSFET (Metal Oxide Semiconductor Field Effect Transistor) that are set onto the silicon semiconductor layer 4 of the first exemplary embodiment 1. Device isolation areas 10 for forming the device isolation layers 9 are set to their corresponding areas that surround the diode forming area 6 and the transistor forming areas 8*a* and 8*b* in generally rectangular frame form over their peripheries.

Each of the device isolation layers 9 is formed in the silicon semiconductor layer 4, lying in the device isolation areas 10 so as to reach the BOX film 3, using an insulating material such as silicon oxide. The device isolation layers 9 respectively have the function of electrically insulating and separating the adjacent diode forming area 6 from the transistor forming areas 8*a* and 8*b* in the silicon semiconductor layer 4. Incidentally, it is to be understood that the device isolation layers 9 are shown crosshatched in the figures only for purpose of distinguishing these layers from adjacent structures.

Reference numeral 12 indicates a P+ diffusion layer having a relatively high concentration of P-type dopant. This diffusion layer 12 is formed by diffusing a P-type impurity (i.e., dopant) such as boron (B) into the corresponding silicon semiconductor layer 4 of the diode forming area 6 in a relatively high concentration. As shown in FIG. 1, the P+ diffusion layer 12 has a shape generally resembling a comb that comprises an edge portion 12*a* contacting one edge 9*a* of a corresponding device isolation layer 9, and a plurality of comb tooth portions 12*b* that extend from the edge portion 12*a* and border a ridge portion of the device isolation layer 9, which in exemplary form is oriented generally perpendicular to the edge portion 12*a* on two sides, with a third side being generally parallel to the edge portion 12*a* but spaced away from the edge portion. In other words, the P+ diffusion layer 12 of this first exemplary embodiment is formed in a generally "π-shaped" fashion so that the comb tooth portions 12*b* are caused to extend from the edge portion 12*a*.

Reference numeral 14 indicates an N+ type diffusion layer having a relatively high concentration of N-type dopant. This diffusion layer 14 is formed by diffusing a dopant opposite to the P-type high-concentration diffusion layer (i.e., an N-type impurity such as phosphor (P), arsenic (As) or the like) into the corresponding silicon semiconductor layer 4 in the diode forming area 6 in a relatively high concentration. As shown in FIG. 1, the N+ diffusion layer 14 has a shape generally resembling a comb that comprises an edge portion 14*a* contacting an opposite edge of a corresponding device isolation layer 9, and a plurality of comb tooth portions 14*b* that extend from the edge portion 14*a* and border a ridge portion of the device isolation layer 9, where the ridge portion, in exemplary form, is oriented generally perpendicular to the edge portion 14*a* on two sides, with a third side being generally parallel to the edge portion 14*a* but spaced away from the edge portion. The N+ diffusion layer 14 of the present embodiment is formed in a generally "E-shaped" fashion so that the comb tooth portions 14*b* are caused to extend from the ridge portion 14*a*.

Reference numeral 15 indicates a P– diffusion layer having a relatively a low concentration of P-type dopant. This diffusion layer 15 is formed by diffusing a P-type impurity into the silicon semiconductor layer 4 contacting the P+ diffusion layer 12 and the N+ diffusion layer 14, where the diffusion layers 12,14 are respectively spaced away from each other and disposed in an opposing relationship with the tooth portions 12*b* and 14*b*. This P– diffusion layer 15 corresponds to a region or portion where electron-positive hole pairs are generated by light characterized as exhibiting an ultraviolet wavelength, where the ultraviolet light is absorbed into a depletion layer formed herein.

With the above configuration, the photodiode 1 of this first exemplary embodiment is formed in such a manner that the P+ diffusion layer 12 and the N+ diffusion layer 14 are disposed in an opposing relationship with the tooth portions 12*b* and 14*b*, with the P– diffusion layer 15 interposing the diffusion layers 12,14, and the peripheral edge and ridge portions 12*a*,12*b*,14*a*14*b*, forming a boundary 16 between the P+ diffusion layer 12 and the P– diffusion layer 15, as well as forming a boundary between the N+ diffusion layer 14 and the P– diffusion layer 15.

Reference numerals 17 indicate silicide layers that are conductive, which in exemplary form comprise a silicon compound formed by combining a high melting-point metal such as cobalt (Co), titanium (Ti), Nickel (Ni) or the like with silicon by annealing or other similar heat treatment. The silicide layers 17 are respectively formed above the P+ diffusion layer 12 and the N+ diffusion layer 14, while being spaced away from the boundaries 16. Incidentally, the silicide layers 17 are shown hatched in the figures only for purpose of distinguishing these layers from adjacent structures. Thus, non-silicide portions 18 of the P+ diffusion layer 12 and the N+ diffusion layer 14 lie between the peripheral edges of the silicide layers 17 and the boundaries 16.

The thickness of the silicon semiconductor layer 4 of this first exemplary embodiment is formed on the order 50 nanometers or less to provide a photodiode 1 having sensitivity only in the ultraviolet region with a wavelength on the order of about 400 nanometers or less. That is, light or optical absorbance $I/I_o$ in the silicon is represented by the Beer's law expressed in Equation #1 using light or optical absorption coefficient α:

$$I/I_o = e^{(-\alpha Z)} \quad \text{Equation \#1}$$

where Z is the depth of penetration or entrance of light; I is the light intensity at depth Z; and, $I_o$ is the intensity of incident light.

Figure 6:
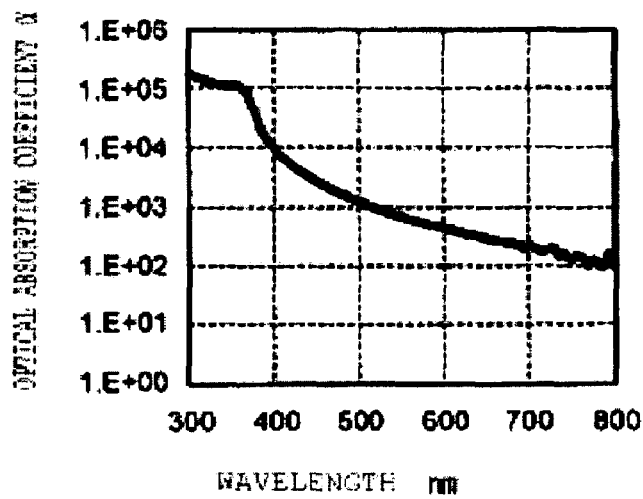
FIG. 6 is a graph illustrating how an optical absorption coefficient of silicon changes with changing wavelength.
Figure 7:
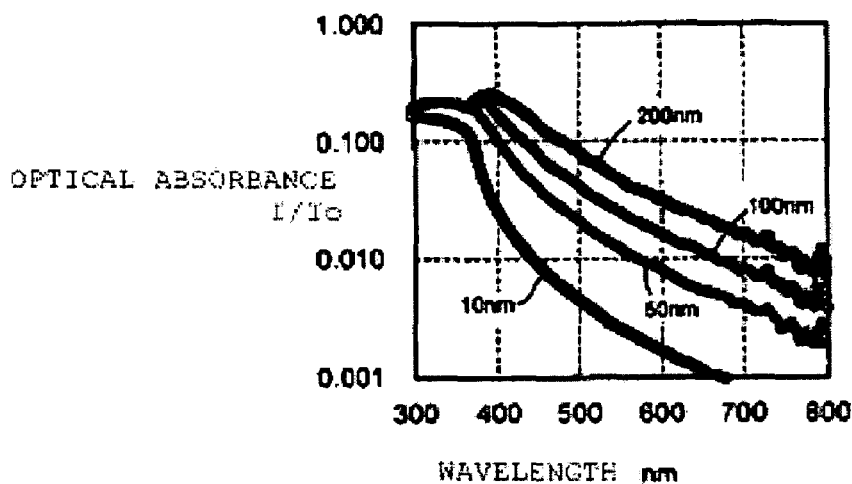
FIG. 7 is a graph illustrating how an optical absorbance changes with changing thicknesses of a silicon semiconductor layer.
Figure 8:
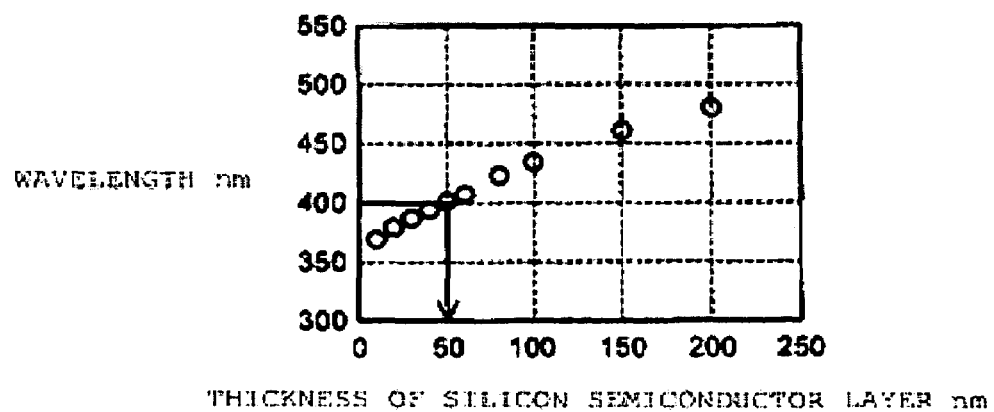
FIG. 8 is a graph illustrating how wavelength changes with changing thicknesses of the silicon semiconductor layer.

The optical absorption coefficient α depends on wavelength, as shown in FIG. 6. When the optical absorbance $I/I_o$ is determined for various thicknesses (Z) of the silicon semiconductor layer 4 using Equation #1, graphs may be generated such as those shown in FIG. 7. It is to be understood that when the optical absorbance $I/I_o$ is 0.1 or less (i.e., 10% or less as shown in FIG. 7), the optical absorbance $I/I_o$ abruptly changes and the wavelength is transitioned in a short-wavelength direction (i.e., the direction of the ultraviolet region as the thickness becomes thinner). As shown in FIG. 8, it is understood that when the wavelength is such that the optical absorbance I/Io with respect to the thickness of the silicon semiconductor layer 4 is brought to 10%, the thickness of the silicon semiconductor layer 4 may be set to approximately 50 nanometers or less to obtain a photodiode 1 having sensitivity only in the ultraviolet region with the wavelength on the order of 400 nanometers or less. Therefore, the thickness of the silicon semiconductor layer 4 for detecting only the ultraviolet region may be selectively set to approximately 50 nanometers or less, and in exemplary form, its lower limit may be set to 3 nanometers.

The reason why the thickness of the silicon semiconductor layer 4 is set to greater than or equal to 3 nanometers is that it becomes difficult to accommodate variations in the thickness where the silicon semiconductor layer 4 is formed in the semiconductor wafer, as the thickness thereof may be set thinner. As shown in FIG. 5(*e*), the photodiode 1 of this first exemplary embodiment is formed together with the nMOS element 7*a* and pMOS element 7*b* formed in the silicon semiconductor layer 4.

The nMOS element 7a employed in this first exemplary embodiment is formed in its corresponding transistor forming area 8a on the silicon semiconductor layer 4, where a gate oxide film (i.e., layer) 21a comprises a relatively thin insulating film of silicon oxide or the like.

Figure 5E:
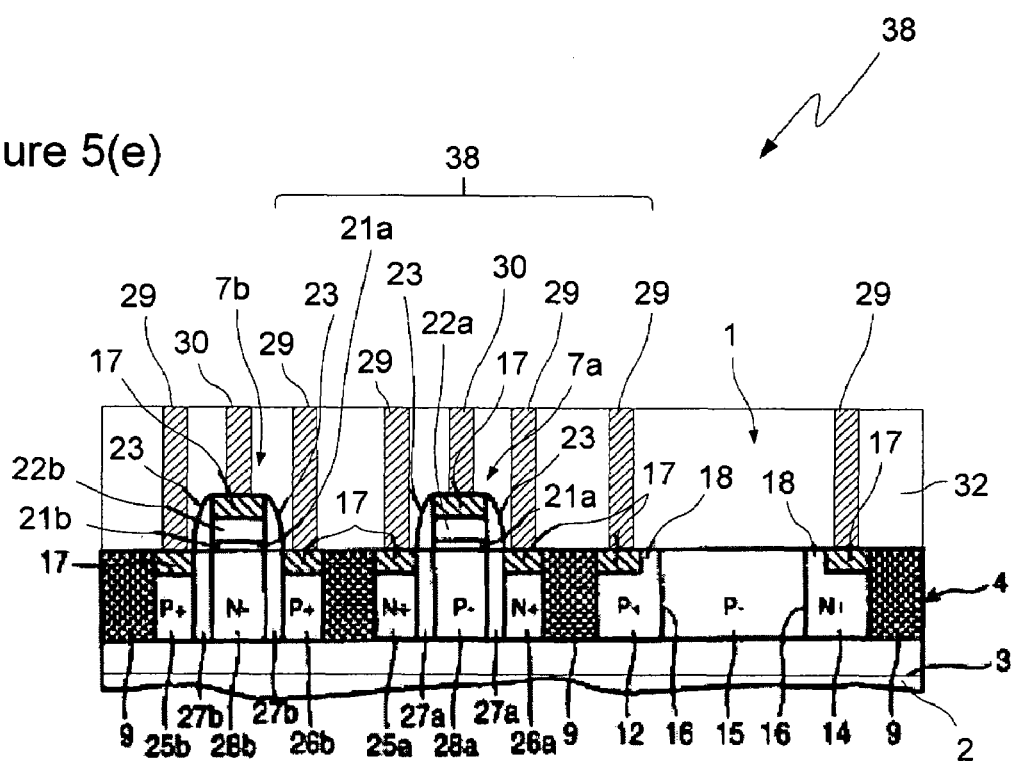

Referring specifically to FIG. 5(e), a gate electrode 22a is formed over the gate oxide film 21a and comprises polysilicon or the like having the same type of impurity (N-type in this first exemplary embodiment) as a source layer 25a, where the impurity is diffused in a relatively high concentration. The gate electrode 22a is formed in generally the center of the transistor forming area 8a as viewed in a gate-length direction and in an opposing relationship with the silicon semiconductor layer 4 of the transistor forming area 8a, where the gate oxide film 21a interposes the silicon semiconductor layer 4 and the gate electrode 22a. Sidewalls 23, comprising an insulating material such as silicon nitride ($Si_3N_4$), are formed on their corresponding side surfaces of the gate oxide film 21a and the gate electrode 22a. It should be noted that a portion of the gate electrode 22a is later silicided, and thus the sidewalls 23 are then located on the side surfaces of the gate oxide film 21a, the gate electrode 22a, and silicide layer 17.

The source layer 25a and a drain layer 26a, where the N-type impurity is diffused in a relatively high concentration, are formed in the silicon semiconductor layer 4 on both sides of the gate electrode 22a in the transistor forming area 8a. Extension portions 27a for the source layer 25a and the drain layer 26a are respectively formed to the sides of the gate electrode 22a and underneath the sidewalls 23, but the concentration of the impurity is not as high as the other layers 25a, 26a.

The silicide layers 17 within the semiconductor layer 4 are respectively formed above the source layer 25a and the drain layer 26a. A channel region 28a of the nMOS element 7a includes a P-type impurity, opposite to that of the source layer 25a, that is diffused in a relatively low concentration. The channel region 28a is formed in the silicon semiconductor layer 4, located between the extension portions 27a for the source layer 25a and the drain layer 26a, but located below the gate oxide film 21a.

The pMOS element 7b employed in this first exemplary embodiment is formed in a similar manner to the nMOS element 7a, except that the type (N-type vs. P-type) of impurity is reversed. The pMOS element 7b has a source layer 25b and a drain layer 26b formed in the silicon semiconductor layer 4 of the transistor forming area 8b, and a gate electrode 22b formed with sidewalls 23 sitting above extension portions 27b of the source layer 25b and the drain layer 26b, where a gate oxide film 21b interposes the sidewalls 23. The silicide layers 17 of the pMOS and nMOS elements 7a, 7b, are respectively formed above the gate electrode 22a, 22b. Likewise, the silicide layers 17 in the silicon semiconductor layer 4 are formed directly above the source layers 25a, 25b and the drain layers 25a, 26b.

The P+ diffusion layer 12, the source layer 25b the pMOS element 7b, and drain layer 26b of the pMOS element 7b, are each formed by diffusing the same P-type impurities in substantially the same concentration. Likewise, the N+ diffusion layer 14, the source layer 25a of the nMOS element 7a, and drain layer 26a of the nMOS element 7a are each formed by diffusing the same N-type impurities in substantially the same concentration. Further, the P− diffusion layer 15 of the photodiode 1, as well as the channel region 28a of the nMOS element 7a, is each formed by diffusing the same P-type impurities in substantially the same concentration. Incidentally, as used herein, the gate-length direction extends from the source layer 25a or 25b to the drain layer 26a or 26b, and in parallel with the upper surface of the silicon semiconductor layer 4 or its opposite direction.

Referring specifically to FIGS. 3-5, a resist mask 31 is used as a mask member, where the resist mask is formed by photolithography to exposure and development a positive or negative resist applied onto the silicon semiconductor layer 4. The resist mask 31 functions as a mask for etching and ion implantation employed in the present embodiment. Those skilled in the art are familiar with photolithography and the usage of positive or native resists to form masks on a substrate.

The following is an explanation of an exemplary method for manufacturing the photo integrated circuit 1 according to this first exemplary embodiment. Initially, as shown in FIG. 3(a), a silicon semiconductor layer 4 is formed on a semiconductor wafer (not shown) to a thickness of approximately 50 nanometers using a known thermal oxidation method. Thereafter, a sacrificial oxide film is formed in a thin silicon layer of the semiconductor wafer having an SOI structure by forming an BOX film 3 by an SIMOX (Separation by Implantation of Oxygen) method with a thin silicon layer left behind. Alternatively, a thin silicon layer of a semiconductor wafer of an SOI structure is formed on the BOX film 3 with a thin silicon layer attached thereto and removing the same by wet etching.

Referring to FIG. 3(a), a pad oxide film (not shown) having a relatively thin thickness is formed on the silicon semiconductor layer 4 (having a predetermined thickness of approximately 50 nanometers) by a known thermal oxidation method. A silicon nitride film (not shown), comprising silicon nitride, is formed on the pad oxide film by a CVD (Chemical Vapor Deposition) method. A resist mask (not shown), which covers the diode forming area 6 and transistor forming areas 8a and 8b (i.e., which has exposed each device isolation area 10), is formed on the silicon nitride film by photolithography. With this as a mask, the silicon nitride film is removed by anisotropic etching to expose the pad oxide film.

The resist mask is removed and the silicon semiconductor layer 4 of each device isolation area 10 is oxidized by a LOCOS (Local Oxidation of Silicon) method, where the exposed silicon nitride film acts as a mask to form device isolation layers 9 that reach the BOX film 3. The silicon nitride film and the pad oxide film are removed by wet etching, thereby forming the device isolation layers 9 in the respective device isolation areas 10 of the silicon semiconductor layer 4.

A resist mask 31 having exposed the diode forming area 6 and transistor forming area 8a is formed on the silicon semiconductor layer 4 by photolithography. Using the resist mask 31 as a blocking layer, P-type impurity ions are diffused into the exposed silicon semiconductor layer 4 to form a P− diffusion layer 15 of the photodiode 1 and a channel region 28a of an nMOS element 7a. It is to be understood that at this step, the P-type impurity (represented by the downward arrows) has been diffused into the silicon semiconductor layer 4 in a relatively low concentration.

Referencing FIG. 3(b), the resist mask 31 is removed and a second resist mask 31 is formed by photolithography to expose a transistor forming area 8b on the silicon semiconductor layer 4. N-type impurity ions are diffused into the exposed silicon semiconductor layer 4 with the resist mask 31 acting to block diffusion of N-type impurities in unexposed areas, thereby forming a channel region 28b of a pMOS element 7b by diffusing N-type impurities (represented by the downward arrows) into the silicon semiconductor layer 4 in a relatively low concentration. Thereafter, this second resist mask 31 is removed.

Referring to FIG. 3(c), the upper surface of the silicon semiconductor layer 4 is oxidized by a known thermal oxidation method to form a silicon oxide film 33. Polysilicon is deposited on the silicon oxide film 33, using known deposition techniques, to form a relatively thick polysilicon layer 34.

Referencing FIG. 3(d), a resist mask (not shown), which covers the forming areas of gate electrodes 22a,22b at the centers of the transistor forming areas 8a,8b (as viewed in a gate-length direction), is formed on the polysilicon layer 34 by photolithography. Using the resist mask as an etch-through layer, the polysilicon layer 34 and the silicon oxide film 33 are etched away in the exposed areas of the mask by dry etching or the like, thereby forming the gate electrodes 22a,22b and gate oxides 21a,21b above the channel regions 28a,28b of the silicon semiconductor layer 4. Thereafter, the mask is removed.

With reference to FIG. 4(a), another resist mask 31, formed by photolithography, exposes at least portions of the forming areas 6,8a (corresponding to the portion shaped in the form of a backwards "E" shown in FIG. 1 of the N+ diffusion layer 14). N-type impurity ions (represented by the downward arrows) are diffused into the polysilicon of the silicon semiconductor layer 4 and gate electrode 22a exposed by the resist mask 31 to form extension portions 27a of the nMOS element 7a at which an N-type impurity is diffused into the silicon semiconductor layer 4 on both sides of the gate electrode 22a in a median concentration. Likewise, N-type impurity ions (represented by the downward arrows) are diffused into the polysilicon of the silicon semiconductor layer 4 at median concentrations to form the diffusion layer 14 within the diode forming area 6. Thereafter, the mask 31 is removed.

Looking at FIG. 4(b), a further resist mask 31, formed by photolithography, exposes at least portions of the forming areas 6,8b (corresponding to the portion shaped in the form of "π" of FIG. 1 of the P+ diffusion layer 12). P-type impurity ions (represented by the downward arrows) are diffused into the polysilicon of the silicon semiconductor layer 4 and gate electrode 22b exposed by the resist mask to form extension portions 27b of the pMOS element 7b at which a P-type impurity is diffused into the silicon semiconductor layer 4 on both sides of the gate electrode 22b in a median concentration. Likewise, P-type impurity ions (represented by the downward arrows) are diffused into the polysilicon of the silicon semiconductor layer 4 at median concentrations to form the P+ diffusion layer 12 within the diode forming area 6. Thereafter, the mask 31 is removed.

Referring to FIG. 4(c), a silicon nitride layer is deposited by CVD on the gate electrodes 22a,22b and on the exposed portions of silicon semiconductor layer 4 by a CVD. The silicon nitride film is etched by anisotropic etching to expose the upper surfaces of the gate electrodes 22a,22b and the upper surface of the silicon semiconductor layer 4, thereby forming sidewalls 23 on the side surfaces of the gate electrodes 22a,22b.

Referencing FIG. 4(d), still another resist mask 31 is formed by photolithography covering the transistor forming area 8b, the P+ diffusion layer 12, and the P− diffusion layer 15. N-type impurity ions (represented by the downward arrows) are diffused into the polysilicon of the silicon semiconductor layer 4 and the gate electrode 22a exposed by the resist mask 31 to form a source layer 25a and a drain layer 26a of the nMOS element 7a on both sides of the sidewalls 23, as well a gate electrode 22a with a relatively high concentration of N-type impurity ions. Likewise, an N-type impurity is diffused into the silicon semiconductor layer 4 to form an N+ diffusion layer 14 of the photodiode 1 with a relatively high-concentration of N-type impurity ions within the diode forming area 6. Thereafter, the mask 31 is removed.

Looking to FIG. 5(a), another resist mask 31 is formed by photolithography to expose the transistor forming area 8b and a portion of the diode forming area 6. P-type impurity ions are diffused into the polysilicon of the silicon semiconductor layer 4 and the gate electrode 22b exposed by the resist mask 31 to form a source layer 25b and a drain layer 26b of the pMOS element 7b on both sides of the sidewalls 23, as well a gate electrode 22b with a relatively high concentration of P-type impurity ions. Likewise, an P-type impurity is diffused into the silicon semiconductor layer 4 to form an P+ diffusion layer 12 of the photodiode 1 with a relatively high-concentration of P-type impurity ions within the diode forming area 6. Thereafter, the mask 31 is removed.

With reference to FIG. 5(b), an annealing or heat treatment for activating the respective diffusion layers is carried out. Thereafter, a resist mask 31 is formed by photolithography to expose a portion of the diode forming area 6 denoted as the non-silicide portion forming area comprising non-silicide portions 18 that contact boundaries 16 between the P+ diffusion layer 12 and the N+ diffusion layer 14, as well as between the P+ diffusion layer 12 and the P− diffusion layer 15. Thereafter, silicon oxide is deposited by the CVD method within the opening in the mask 31 to form a silicon oxide film 36. Subsequent to the CVD process, the resist mask 31 is removed.

The resist mask 31 for forming the silicon oxide film 36 is set in such a manner that all allowance for the alignment of the resist masks 31 shown in FIGS. 4(a), 4(b), 4(d), 5(a) are taken into consideration to provide the non-silicide portions 18, 18a intentionally.

Referring to FIG. 5(c), cobalt is deposited on the gate electrodes 22a,22b and on the entire silicon semiconductor layer 4 by a known sputtering method to form a high melting-point metal layer. The high melting-point cobalt layer that contacts silicon above the P+ diffusion layer 12, the N+ diffusion layer 14, the gate electrodes 22a,22b, the source layers 25a,25b, and the drain layers 26a,26b is silicidized by a known salicide process to form silicide layers 17. Since, at this time, the forming areas 18a of the non-silicide portions 18 of the P+ diffusion layer 12 and the N+ diffusion layer 14 are covered with the silicon oxide film 36, the P+ diffusion layer 12 and the N+ diffusion layer 14 remain largely as they are without forming complete silicide layers 17. The non-silicide portions 18 are formed at their corresponding portions of the P+ diffusion layer 12 and the N+ diffusion layer 14 each adjacent to the boundary 16 for the P− diffusion layer 15. Further, the silicide layers 17 each have the same metal component. In this case, the salicide processing includes a heat treatment and the removal of the unreacted high melting-point cobalt (metal) layer.

Referencing FIG. 5(d), the silicon oxide film 36 is removed after the formation of the silicide layers 17, so that the corresponding photodiode 1 and nMOS and pMOS elements 7a and 7b according to this first exemplary embodiment are formed.

Referring to FIG. 5(e), an insulating material, such as silicon oxide, is deposited relatively thick (approximately 800 nanometers) over the entire surface by a known CVD method. A flattening or planarization process is carried out on the upper surface of the silicon oxide layer to form an interlayer insulating film 32. A resist mask (not shown) having apertures or openings to expose the interlayer insulating film 32 thereby allowing contact hole formation over the silicide layers 17 of the P+ diffusion layer 12 and N+ diffusion layer 14, the source layers 25a,25b, and the drain layers 26a,26b is formed by known photolithography techniques. Contact holes (not shown) are then formed by anisotropic etching (for selectively etching silicon oxide through openings in the resist mask (not shown)) that extend through the interlayer insulating film 32 and reach the silicide layers 17. After the removal of the resist mask, a conductive material 29 (such as copper) is directed into the contact holes by a CVD method or sputter method to form contact plugs. In exemplary form, the contact plugs have a width of approximately 280 nanometers). A flattening or planarization process is carried out after contact plug formation to expose the upper surface of the interlayer insulating film 32.

A resist mask (not shown) having apertures or openings to expose the interlayer insulating film 32 thereby allowing contact hole formation over the silicide layers 17 above the gate electrodes 22a,22b is formed by known photolithography techniques. Contact holes (not shown) are then formed by anisotropic etching (for selectively etching silicon oxide through openings in the resist mask (not shown)) that extend through the interlayer insulating film 32 and reach the silicide layers 17. After the removal of the resist mask, a conductive material 30 (such as copper) is directed into the contact holes by a CVD method or sputter method to form contact plugs. Thereafter, a flattening process is performed on the contact plugs to expose the insulating layer 32 and plugs 29,30, thereby forming a photo integrated circuit (IC) 38 according to this first exemplary embodiment.

Referring to FIG. 5(e), in the photodiode 1 formed in accordance with this first exemplary process, its P− diffusion layer 15 diffuses the same P-type impurity as that for the channel region 28a of the nMOS element 7a constituting the photo IC 38 in generally the same concentration. Therefore, the channel region 28 of the nMOS element 7a can be formed on a simultaneous basis using the same resist mask 31 (as shown in FIG. 3(a)) for forming the channel region 28a, thus making is possible to simplify the manufacturing process of the photo IC 38. Further, since the N+ diffusion layer 14 of the photodiode 1 diffuses the same N-type impurity as that for the source and drain layers 25a and 26a of the nMOS element 7a constituting the photo IC 38 in generally the same concentration, the source layer 25a and the drain layer 26a can be formed simultaneously using the same resist mask 31, as shown in FIG. 4(d), for forming the source layer 25a and the drain layer 26a of the nMOS element 7a, thus making it possible to simplify the manufacturing process of the photo IC 38. Still further, since the P+ diffusion layer 12 of the photodiode 1 diffuses the same P-type impurity as that for the source layer 25b and the drain layer 26b of the nMOS element 7b constituting the photo IC 38 in generally the same concentration, the source layer 25b and the drain layer 26b can be formed simultaneously using the same resist mask 31 (as shown in FIG. 5(a)) for forming the source layer 25b and the drain layer 26b of the pMOS element 7b, thus making it possible to simplify the manufacturing process of the photo IC 38. Even further, since the silicide layers 17 provided above the P+ diffusion layer 12 and the N+ diffusion layer 14 are formed of the same metal component as the silicide layers 17 provided above the source layers 25a and 25b and drain layers 26a and 26b of the nMOS element 7a and pMOS element 7b, they can be formed simultaneously using the same high melting-point metal layer (as shown in FIG. 5(c)) for forming the silicide layers 17 over the source layers 25a and 25b and drain layers 26a and 26b of the nMOS element 7a and pMOS element 7b, thus making it possible to simplify the manufacturing process of the photo IC 38.

In the photodiode 1 according to this first exemplary embodiment, the silicide layers 17 formed above the P+ diffusion layer 12 and N+ diffusion layer 14 are intentionally spaced away from the boundaries 16 relative to the P− diffusion layer 15 by the resist mask 31, taking into account the alignment of the resist masks 31 utilized and shown in FIGS. 4(a), 4(b), 4(d), 5(a), and 5(b) so that the non-silicide portions 18 are formed between the silicide layers 17 and the boundaries 16 for the P− diffusion layer 15. Therefore, the silicide layers 17 do not extend to over the P− diffusion layer 15 and a signal-to-noise (S/N) ratio of a dark current to a photoelectric current can be ensured sufficiently. It is also possible to prevent variations in the characteristics of the photodiode 1 and stabilize the quality thereof.

The P+ diffusion layer 12 and the N+ diffusion layer 14 are respectively formed in a state in which the ridge sides of their edge portions 12a and 14a are held close to one edge 9a lying inside each device isolation layer 9 and other edge 9b opposite thereto. Therefore, if the non-silicide portions 18 are formed only on the sides of the boundaries 16 between the peripheral edges of the P+ diffusion layer 12 and the N+ diffusion layer 14 and the P− diffusion layer 15, as compared with the photodiode 1 in which all peripheral edges of the P+ diffusion layer 12 and the N+ diffusion layer 14 are formed close to the P− diffusion layer 15, then the above effect can be obtained. Further, the intentional formation of the non-silicide portions 18 can be done easily, and the effect of reducing sheet resistance by enlarging the area of each silicide layer 17 can further be enhanced.

Figure 9:
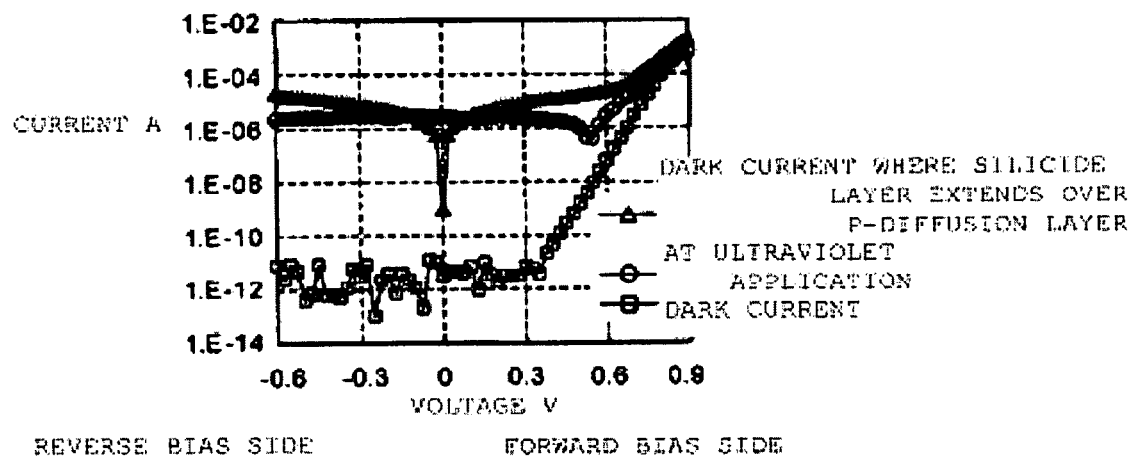
FIG. 9 is a graph illustrating the relationship between current and voltage for the first exemplary embodiment.

Experimental results of current-voltage characteristics at the time that ultraviolet light is applied to the photodiode 1 of this first exemplary embodiment are shown in FIG. 9. The horizontal axis in FIG. 9 indicates the voltage applied between the P+ diffusion layer 12 and the N+ diffusion layer 14, and the vertical axis in FIG. 9 indicates current detected when the voltage is applied. The thickness of the silicon semiconductor layer 4 of the photodiode 1 used to obtain these experimental results was approximately 50 nanometers and the wavelength of the applied ultraviolet radiation was approximately 395 nanometers.

The dark current was measured in a state in which the photodiode 1 was placed within a darkroom. As shown in FIG. 9, it is understood that in the photodiode 1 according to this first exemplary embodiment, there is a definite difference for distinguishing between at-ultraviolet application and the dark current on the reverse bias side, and the S/N ratio of the dark current to photoelectric current is sufficiently ensured. On the other hand, it is understood that a dark current shown with "Δ" marks for comparison of a case in which the silicide layers 17 extend over the P-diffusion layer 15 is nearly equal to a photoelectric current at the ultraviolet application in this first exemplary embodiment and is not definitely distinguished from the at-ultraviolet application, thereby making it unable to ensure the S/N ratio sufficiently, whereby such case is inappropriate as a photodiode for detecting the ultraviolet light.

In this first exemplary embodiment, the P+ diffusion layer contacts one edge lying inside the frame-shaped device isolation layer formed in the silicon semiconductor layer of the SOI structure. The N+ diffusion layer that contacts the other edge opposite to one edge of the device isolation layer is disposed via the P− diffusion layer. The silicide layers are formed over the P+ diffusion layer and the N+ diffusion layer being spaced away from the boundaries between the P+ diffusion layer and N+ diffusion layer and the P− diffusion layer. It is thus possible to easily form the non-silicide portions with the sides of the boundaries of the P− diffusion layer not brought into contact with the device isolation layer at the peripheral edges of the P+ diffusion layer and the N+ diffusion layer being spaced away from the P− diffusion layer. Therefore, the silicide layers are prevented from extending over the P− diffusion layer, and the quality of the photodiode can be stabilized.

In the exemplary embodiment, the P− diffusion layer of the photodiode has generally the same concentration of the P-type impurity found in the channel region of the nMOS element. The N+ diffusion layer has the same concentration of the N-type impurity found in the source and drain layers of the nMOS element. The P+ diffusion layer has the same concentration of the P-type impurity found in the source and drain layers of the pMOS element. The silicide layers have the same metal components as the silicide layers formed in the source and drain layers of the nMOS element and the pMOS element. Thus, during the step for forming the channel region of the nMOS element, the step for forming the source layer and drain layer of the nMOS element, and the step for forming the source layer and drain layer of the pMOS element, all can be formed simultaneously using the same resist mask in common. Likewise, at the step for forming the silicide layers in the source and drain layers of the nMOS element and pMOS element, all can be formed simultaneously using the same high melting-point metal layer, thereby making it possible to simplify the manufacturing process of the photo IC 38.

Figure 10:
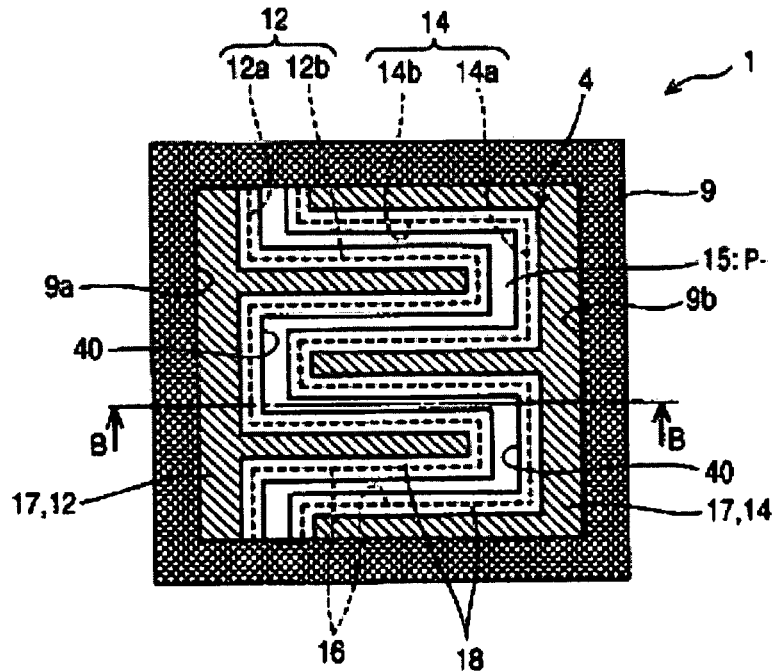
FIG. 10 is a plan view of an upper surface of a photodiode according to a second exemplary embodiment.
Figure 11:
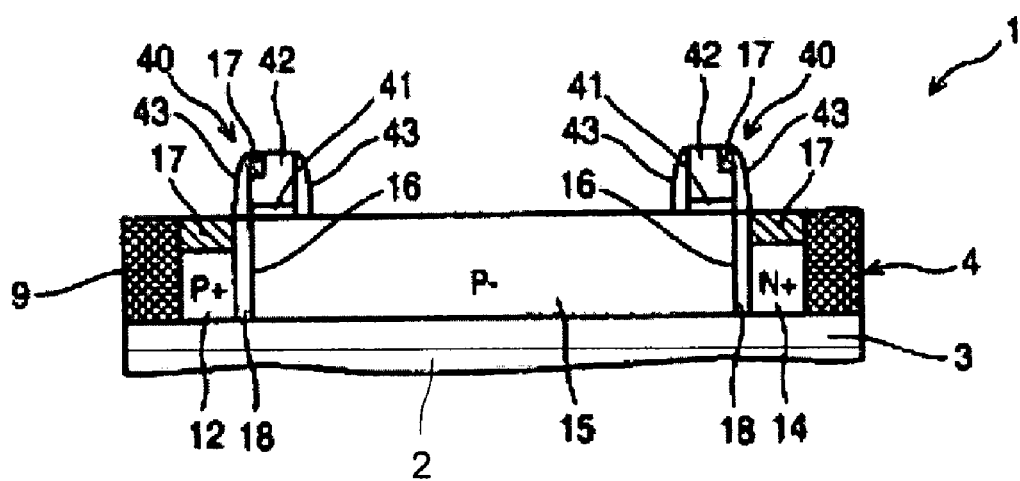
FIG. 11 is a sectional view taken along line B-B of FIG. 10.

Referencing FIGS. 10 and 11, a second exemplary embodiment includes a second exemplary photo integrated circuit 38'. In this second exemplary embodiment, reference numeral 40 indicates a dummy gate. The dummy gate 40 comprises a dummy gate oxide film 41 formed of the same material as gate oxide films 21a,21b of an nMOS element 7a and a pMOS element 7b, a dummy gate electrode 42 formed on the dummy gate oxide film 41 with the same material as gate electrodes 22a,22b, and dummy sidewalls 43 formed of the same material as the sidewalls 23 on their corresponding side surfaces of the gate electrodes 22a,22b. Silicide layers 17 are formed above the dummy gate electrodes 42 on the P+ diffusion layer 12 and N+ diffusion layer 14 sides.

The dummy gate oxide film 41 employed in the present embodiment is formed on a P-diffusion layer 15 so as to cover part located on the P− diffusion layer 15 along the boundaries 16 with a P+ diffusion layer 12 and the N+ diffusion layer 14. The dummy sidewalls 43 formed on the sides of the P+ diffusion layer 12 and the N+ diffusion layer 14 respectively extend on the P+ diffusion layer 12 and the N+ diffusion layer 14 and function as mask members for forming non-silicide portions 18 employed in the present embodiment.

Figure 12:
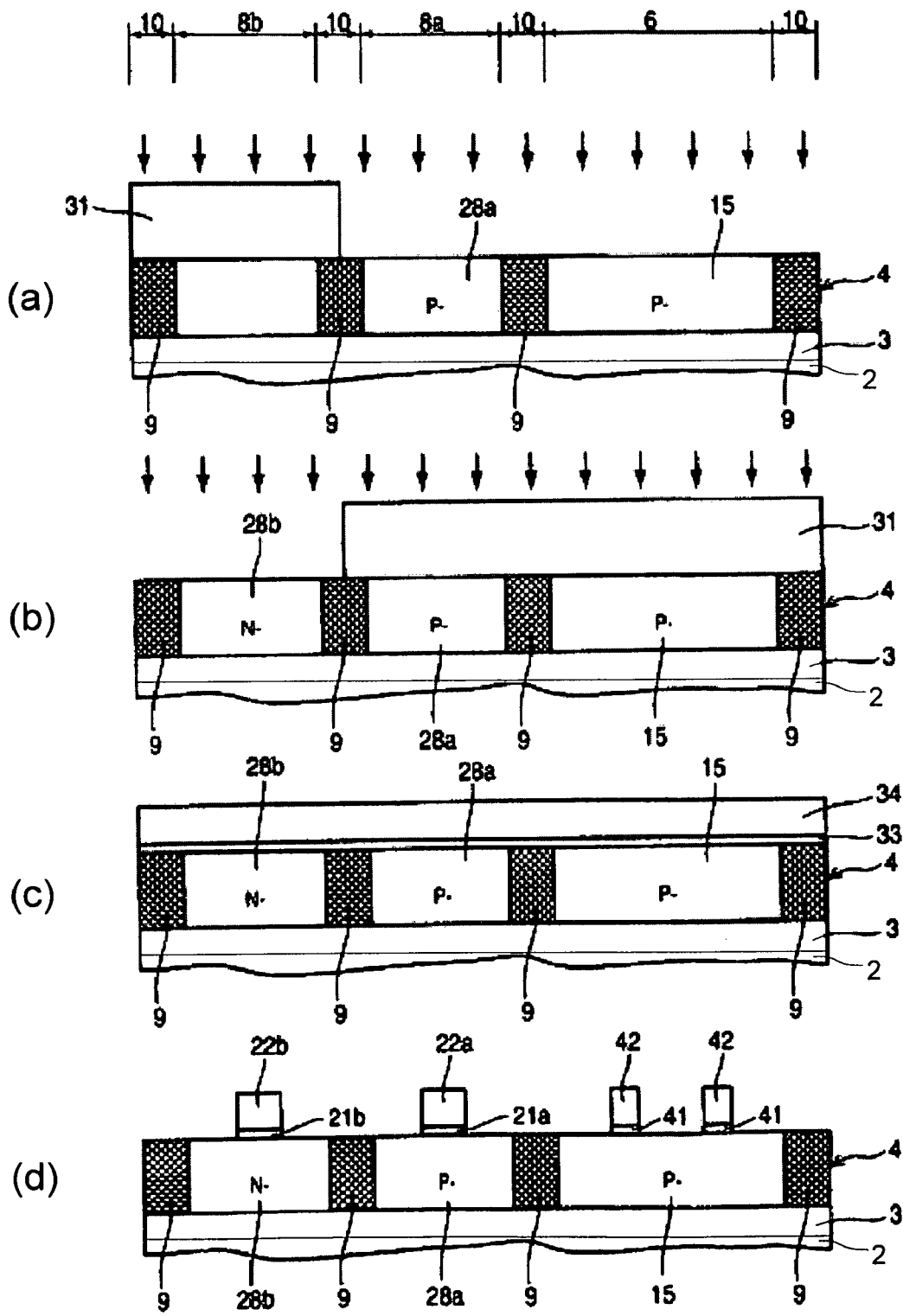
FIG. 12 is a cross-section of a segment of a photo integrated circuit in accordance with the second exemplary embodiment.
Figure 13:
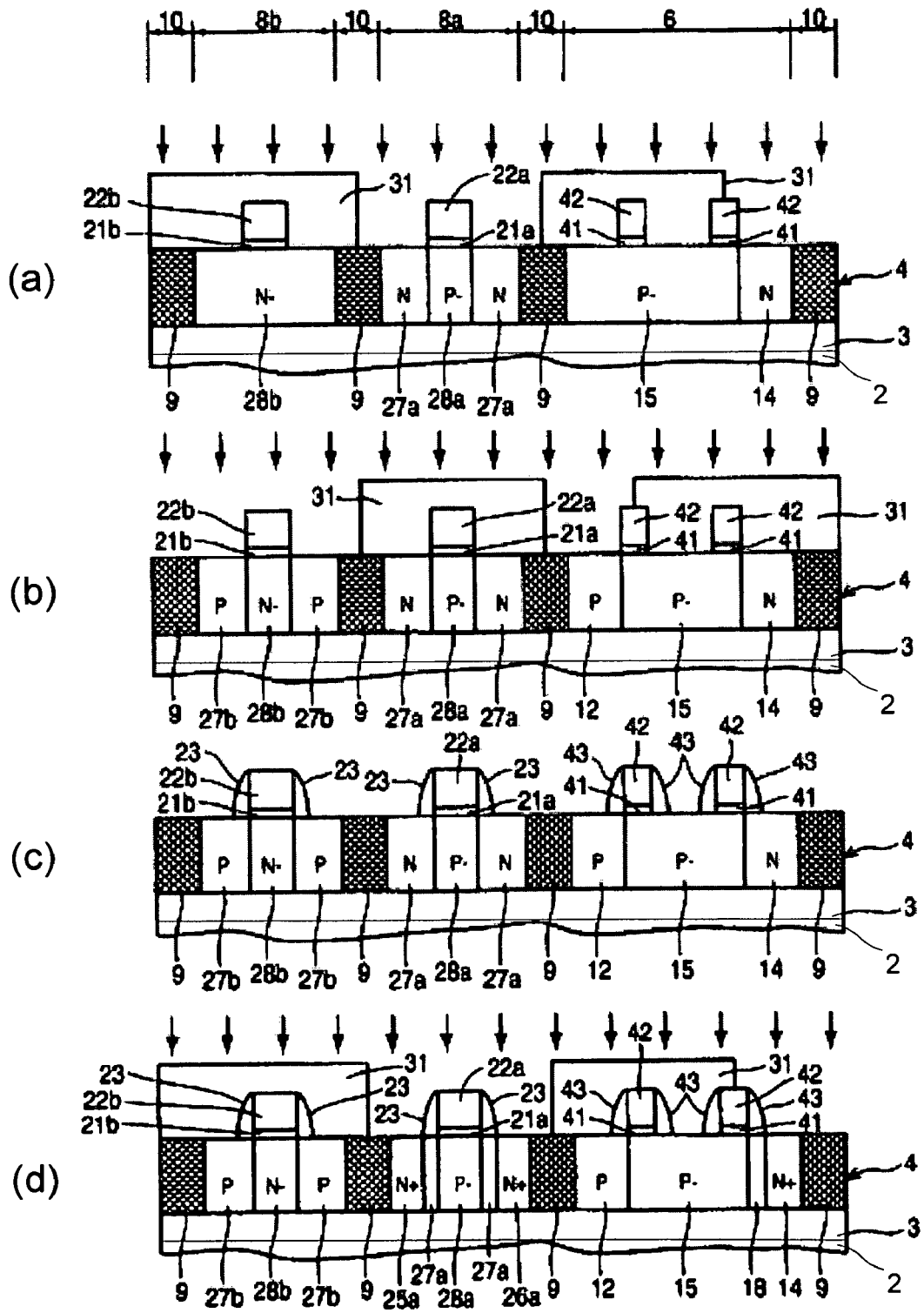
FIG. 13 is a sequential series of cross-sections of integrated circuit segments after completion of certain processing steps in accordance with fabricating a photo integrated circuit of the second exemplary embodiment.
Figure 14:
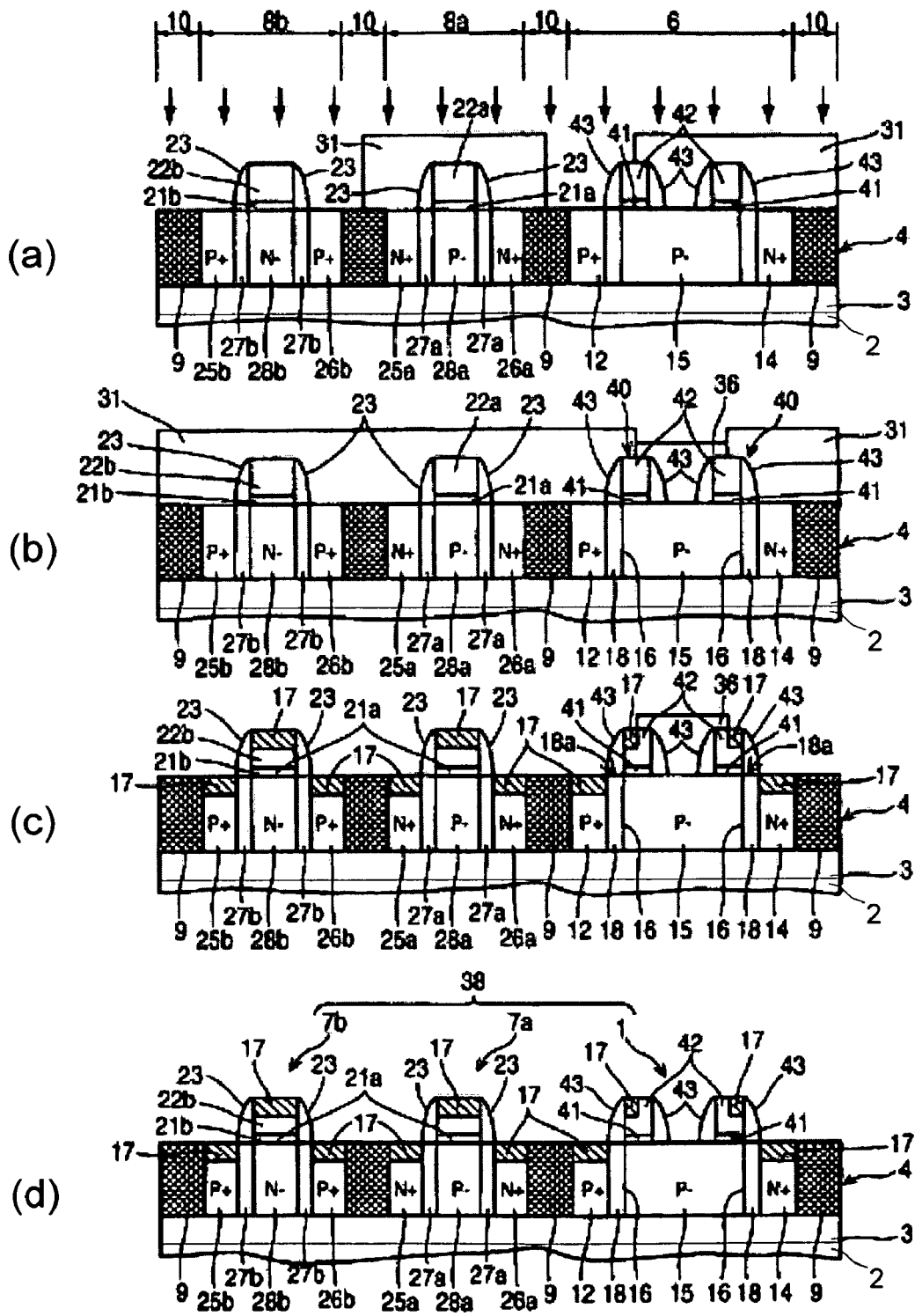
FIG. 14 is a sequential series of cross-sections of integrated circuit segments, after exhausting the processing steps of FIG. 13, after completion of certain processing steps in accordance with fabricating a photo integrated circuit of the second exemplary embodiment.

Referring to FIGS. 12-14, an second exemplary method for manufacturing a photo IC 38' according to this second embodiment includes starting with a silicon semiconductor layer 4 of a semiconductor wafer formed with a thickness of approximately 50 nanometers in a manner similar to the first exemplary embodiment. Since the operations shown in FIGS. 12(a)-12(c) parallel those of FIGS. 3(a)-3(c), their description has been omitted for purposes of brevity.

Looking at FIG. 12(d), a resist mask (not shown) is formed to cover oxide film 33 and polysilicon layer 34 and developed using known photolithography techniques to facilitate anisotropic etching to form the gate electrodes 22a,22b in the transistor forming areas 8a,8b, as well as the dummy gate electrodes 42 in a diode forming area 6.

Referring to FIG. 13(a), resist masks 31 are fabricated using known photolithography techniques to cover the transistor forming area 8b and the diode forming area 6 up to the center on the dummy gate electrode 42 and expose the forming area 8a and the N+ diffusion layer 14 of the diode forming area 6 (corresponding to the portion shaped in the form of "E" shown in FIG. 10). Using the resist mask 31, extension portions 27a of an nMOS element 7a are formed in the silicon semiconductor layer 4 on both sides of the gate electrode 22a. An N-type impurity of generally median concentration is diffused into polysilicon for the gate electrode 22a, and the N-type impurity of generally median concentration is diffused into the silicon semiconductor layer 4 in the forming area of the N+ diffusion layer 14 on a self-alignment basis.

Referencing FIG. 13(b), the resist masks 31 formed previously are removed, and a resist mask 31 is formed, using known photolithography techniques, to cover the transistor forming area 8a and up to the center on the dummy gate electrode 42 on the side the P+ diffusion layer 12 in the diode forming area 6 (corresponding to the portion shaped in the form of "π" shown in FIG. 10), but exposes the transistor forming area 8b. Using the resist mask 31, a P-type impurity is diffused into the silicon semiconductor layer 4 to form extension portions 27b of a pMOS element 7b on both sides of the gate electrode 22b in a manner similar to the first exemplary embodiment shown and described to correspond to FIG. 4(b). At the same time, P-type impurity of median concentration is diffused into polysilicon for the gate electrode 22b, and P-type impurity of median concentration is diffused into the silicon semiconductor layer 4 in the diode forming area 6 resulting in the P+ diffusion layer 12.

With reference to FIG. 13(c), the resist masks 31 formed during the previous steps are removed to expose the upper surfaces of the gate electrodes 22a,22b and the dummy gate electrodes 42, as well as the upper surface of the silicon semiconductor layer 4 in a manner similar to that described and shown in FIG. 4(c), thereby forming sidewalls 23 and dummy sidewalls 43 on corresponding side surfaces of the gate electrodes 22a,22b and the dummy gate electrodes 42.

Looking at FIG. at FIG. 13(d), resist masks 31 similar to those discussed with respect to FIG. 4(d) are formed using known photolithography techniques. Likewise, in a manner similar to the discussion concerning FIG. 4(d) of the first exemplary embodiment, a source layer 25a and a drain layer 26a of the nMOS element 7a are formed in the corresponding silicon semiconductor layer 4 on both sides of the sidewalls 23 by diffusion of an N-type impurity. At the same time, an N+ diffusion layer 14 of the photodiode 1 is formed on a self-alignment basis, and an N-type impurity of a relatively high concentration is diffused into the gate electrode 22a.

Referring to FIG. 14(a), the resist masks 31 formed during the previous steps are removed, and resist masks 31 similar to those discussed with respect to FIG. 5(a) of the first exemplary embodiment are formed using known photolithography techniques. In a manner similar to the discussion of the first exemplary embodiment, a source layer 25b and a drain layer 26b of the pMOS element 7b are formed in the corresponding silicon semiconductor layer 4 on both sides of the sidewalls 23. At the same time, a P+ diffusion layer 12 of the photodiode 1 is formed on a self-alignment basis, and a P-type impurity of a relatively high concentration is diffused into the gate electrode 22b.

Referencing FIG. 14(b), the resist masks 31 formed during the previous step are removed, followed by carrying out of an annealing process or similar heat treatment to activate the respective diffusion layers. Thereafter, a resist masks 31 is formed using known photolithographic techniques to include an opening in the diode forming region 6 aligned between respective dummy gates 40 and up to the centers dummy gates. Using the resist mask 31, silicon oxide is deposited by a known CVD method to form a silicon oxide film 36.

With reference to FIG. 14(c), the resist mask 31 formed during the previous step is removed, and cobalt is deposited on the gate electrodes 22a,22b, on the dummy gate electrodes 42, and on the exposed portions of the silicon semiconductor layer 4 by a known sputter method, thereby forming a high melting-point metal layer. The high melting-point metal layer that contacts the exposed silicon of the P+ diffusion layer 12 and N+ diffusion layer 14, the gate electrodes 22a,22b, the source layers 25a,25b, the drain layers 26a,26b, and the dummy gate electrodes 42 is silicidized by salicide processing to form silicide layers 17.

Since, at this time, the forming areas 18a of the non-silicide portions 18 of the P+ diffusion layer 12 and the N+ diffusion layer 14 are covered with their corresponding sidewalls 43, non-silicide portions 18 are formed below the dummy sidewalls 43 adjacent to the boundaries 16 between the P− diffusion layer 15 and the N+ diffusion layer 14, as well as between the P− diffusion layer 15 and the P+ diffusion layer 12.

Subsequent to the salicide process, a following heat treatment or an etching step may be performed to remove the unreacted high melting-point cobalt metal layer. In addition, as shown in FIG. 14(d), the silicon oxide film 36 is removed from between respective dummy gates 40.

Figure 14E:
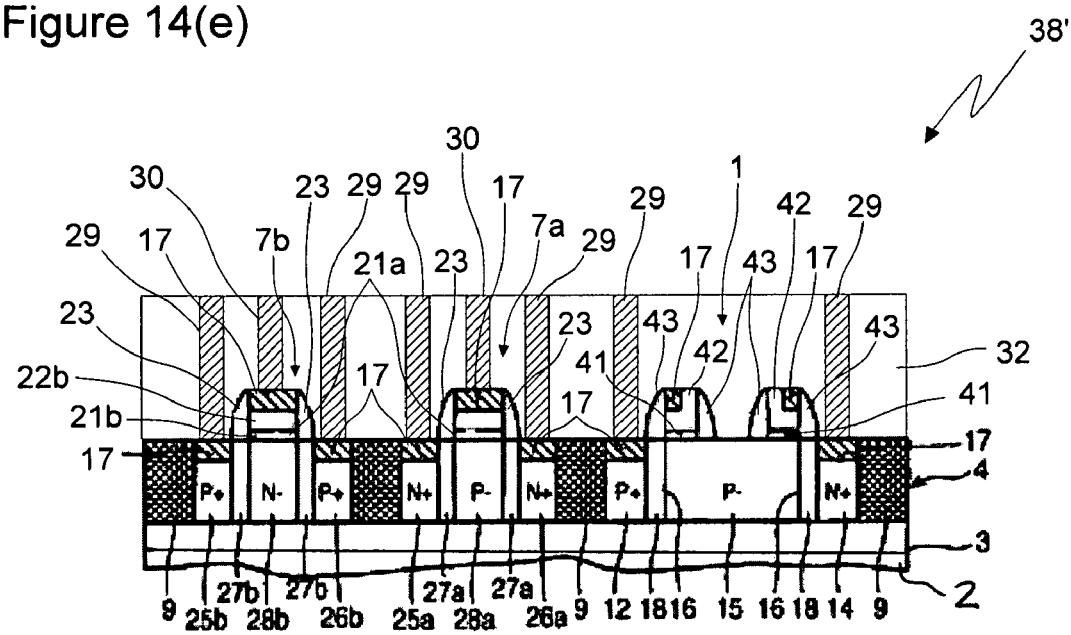

Referencing FIG. 14(e), contact plugs 29 are formed in a similar manner as the discussion provided in the first exemplary embodiment with respect to FIG. 5(e). Thereafter, another process similar the discussion provided with the first exemplary embodiment with respect to FIG. 5(e) is carried out to form contact plugs 30 contacting the silicide layers 17 above the gate electrodes 22a,22b. Since the foregoing steps are so similar in manner to those for the first exemplary embodiment, repetition of these precise steps has been omitted for purposes of brevity.

In the photodiode 1' formed in accordance with this second exemplary embodiment, the respective diffusion layers diffuse the same impurity (i.e., the same type) and in generally the same concentration as the respective diffusion layers for the nMOS element 7a and pMOS element 7b. The silicide layers 17 of the photodiode 1' are formed of the same metal component as the silicide layers 17 provided above the respective diffusion layers for the nMOS element 7a and pMOS element 7b. Therefore, the step for forming the silicide layers 17 can be all done at once using the same resist mask 31 and the same high melting-point metal layer, thus making it possible to simplify the process of manufacturing the photo IC 38'.

The dummy gate oxide films 41, dummy gate electrodes 42 and dummy sidewalls 43 of the dummy gates 40 are respectively formed with the same components as the gate oxide films 21a,21b, the gate electrodes 22a,22b and the sidewalls 23 for the nMOS element 7a and pMOS element 7b. Therefore, the step of forming the gates of the nMOS element 7a and the pMOS element 7b can be formed simultaneously with the dummy gates 40 using the same silicon oxide film 33, the same polysilicon layer 34, the same resist mask 31, and the same silicon nitride film. Thus, it is possible to simplify the process of manufacturing the photo IC 38'.

In the photodiode 1' in accordance with the second exemplary embodiment, the silicide layers 17 formed above the P+ diffusion layer 12 and the N+ diffusion layer 14 are defined by the dummy gate electrodes 42 and the dummy sidewalls 43, and the non-silicide portions 18 are formed on a self-alignment basis between the P+ diffusion layer 12 and N+ diffusion layer 14 and the boundaries 16 with the P− diffusion layer 15. It is therefore possible to easily prevent the silicide layers 17 from extending over the P− diffusion layer 15. The S/N ratio of a dark current to a photoelectric current can be ensured sufficiently. It is thus possible to prevent variations in the characteristic of the photodiode 1' and thereby stabilize the quality thereof.

Incidentally, although the second exemplary embodiment has been explained so that the dummy gate electrodes and the dummy gate oxide films are caused to remain as they are, these may be removed before the formation of the resist masks 31 for cobalt metal deposition or after the formation of the silicide layers 17.

In this second exemplary embodiment, in addition to an advantageous effect similar to the first exemplary embodiment, the dummy sidewalls of the dummy gates are formed close to their corresponding boundaries over the P+ diffusion layer and the N+ diffusion layer on the sides of the boundaries between the P+ diffusion layer and the N+ diffusion layer and the P− diffusion layer. The silicide layers are respectively formed above the P+ diffusion layer and N+ diffusion layer between the dummy sidewalls and the device isolation layer. It is thus possible to easily form the non-silicide portions beneath (i.e., below) the dummy sidewalls on a self-alignment basis by means of the dummy sidewalls.

Incidentally, although the exemplary embodiments have explained so that the low concentration diffusion layer is formed by diffusing the P-type impurity, an advantageous effect similar to the above can be brought about even though it is formed by diffusing the N-type impurity in a relatively low concentration. Although the exemplary embodiments have explained the P+ diffusion layer as being formed in the "π"-shaped fashion and the N+ diffusion layer as being formed in the "E"-shaped fashion, their shapes may be reversed or the number of comb tooth portions may be increased.

Further, although each of the exemplary embodiments has explained so that the plural comb tooth portions are provided in the P+ diffusion layer and the N+ diffusion layer and disposed in tooth engagement with one another, only the edge portions may be disposed in opposing relationship with the low concentration diffusion layer interposed therebetween without providing the comb tooth portions. Furthermore, although each of the embodiments has explained the silicon semiconductor layer as being the silicon semiconductor layer formed on the buried oxide film used as the insulating layer of the SOI substrate, it may be a silicon semiconductor layer of an SOS (Silicon On Sapphire) substrate formed on a sapphire substrate used as an insulating layer, or a silicon semiconductor layer or the like of an SOQ (Silicon On Quartz) substrate formed on a quartz substrate used as an insulating layer.

Following from the above description and invention summaries, it should be apparent to those of ordinary skill in the art that, while the methods and apparatuses herein described constitute exemplary embodiments of the present invention, the invention contained herein is not limited to this precise embodiment and that changes may be made to such embodiments without departing from the scope of the invention as defined by the claims. Additionally, it is to be understood that the invention is defined by the claims and it is not intended that any limitations or elements describing the exemplary embodiments set forth herein are to be incorporated into the interpretation of any claim element unless such limitation or element is explicitly stated. Likewise, it is to be understood that it is not necessary to meet any or all of the identified advantages or objects of the invention disclosed herein in order to fall within the scope of any claims, since the invention is defined by the claims and since inherent and/or unforeseen advantages of the present invention may exist even though they may not have been explicitly discussed herein.

What is claimed is

1. A photodiode comprising:
   a semiconductor layer including a device forming area and a device isolation area that at least partially surrounds the device forming area;
   a device isolation layer formed in the device isolation area;
   a P+ diffusion layer formed in the device forming area;
   an N+ diffusion layer spaced away from the P+ diffusion layer and formed in the device forming area;
   a third diffusion layer formed in the device forming area located between the P+ diffusion layer and the N+ diffusion layer, the third diffusion layer comprising an impurity of the same type and at a lower concentration as one of the P+ diffusion layer and the N+ diffusion layer;
   silicide layers respectively formed at least in an upper portion of the P+ diffusion layer and at least in an upper portion of the N+ diffusion layer and respectively spaced away from a boundary between the third diffusion the P+ diffusion layer and a boundary between the third diffusion layer and N+ diffusion layer;
   an nMOS element and a pMOS element each having a source and a drain formed in a device forming area of the semiconductor layer and a gate electrode opposite to a channel region between the source and drain, with a gate oxide film interposing the channel region and gate electrode; and
   silicide layers respectively formed at least in an upper portion of the source and the drain of each of the nMOS element and the pMOS element.

2. The photodiode of claim 1, wherein the third diffusion layer has approximately the same concentration of the same impurity as the channel region of at least one of the nMOS element and the pMOS element.

3. The photodiode of claim 1, wherein a concentration of impurity of the N+ diffusion layer is approximately the same as a concentration of the same impurity as the source and drain of the nMOS element.

4. The photodiode of claim 1, wherein a concentration of impurity of the P+ diffusion layer is approximately the same as a concentration of the same impurity as the source and dram of the pMOS element.

5. The photodiode of claim 1, wherein a metal component of at least one of the silicide layers is the same as a metal component of at least one of the silicide layers formed in the source and drain of the nMOS element and pMOS element.

6. A photodiode comprising:
   a semiconductor layer including a device forming area and a device isolation are that at least partially surrounds the device forming area;
   a device isolation layer formed in the device isolation area;
   a P+ diffusion layer formed in the device forming area;
   an N+ diffusion layer spaced away from the P+ diffusion layer and formed in the device forming area;
   a third diffusion layer formed in the device forming area located between the P+ diffusion layer and the N+ diffusion layer, the third diffusion layer comprising an impurity of the same type and at a lower concentration as one of the P+ diffusion layer or the N+ diffusion layer;
   dummy sidewalls formed over the P+ diffusion layer and N+ diffusion layer, at least one of the dummy sidewalls overlying a boundary between the P+ diffusion layer and the third diffusion layer, and at least another of the dummy sidewalls overlying a boundary between the N+ diffusion layer and the third diffusion layer; and
   a first silicide layer formed in an upper portion of the P+ diffusion layer, a second silicide layer formed in an upper portion of the N+ diffusion layer, and a third silicide layer formed between the dummy sidewalls and above the device isolation layer.

7. The photodiode of claim 6, further comprising:
   a support substrate; and
   an insulating layer formed over the support substrate;
   wherein the semiconductor layer is formed over the insulating layer.

8. The photodiode of claim 6, wherein:
   the P+ diffusion layer is formed adjacent to a first edge of the device isolation layer; and
   the N+ diffusion layer is formed adjacent to a second edge of the device isolation layer, the second edge being opposite the first edge.

9. The photodiode of claim 6, wherein at least one of the silicide layers is formed adjacent to at least one of a first edge and a second edge of the device isolation layer.

10. The photodiode of claim 6, wherein at least one of the silicide layers is formed to interpose at least an upper portion of the P+ diffusion layer and the device isolation layer.

11. The photodiode of claim 6, wherein at least one of the silicide layers is formed to interpose at least an upper portion of the N+ diffusion layer and the device isolation layer.

12. The photodiode of claim 6, wherein the P+ diffusion layer and the N+ diffusion layer are shaped in comb-shaped form, and an edge side of the comb-shaped form is proximate to the device isolation layer.

13. The photodiode of claim 6, further comprising:
   an nMOS element and a pMOS element each having a source and a drain formed in a device forming area of the semiconductor layer and a ante electrode opposite to a channel region between the source and drain, with a gate oxide film interposing the channel region and gate electrode;
   a fourth silicide layer formed at least in an upper portion of the source of the nMOS element;
   a fifth silicide layer formed at least in an upper portion of the drain of the nMOS element;
   a sixth silicide layer formed at least in an upper portion of the source of the pMOS element; and
   a seventh silicide layer formed at least in an upper portion of the drain of the pMOS element.

14. The photodiode of claim 13, wherein, the third diffusion layer has approximately the same concentration of the same impurity as the channel region of at least one of the nMOS element and the pMOS element.

15. The photodiode of claim 13, wherein a concentration of impurity of the N+ diffusion layer is approximately the same as a concentration of the same impurity as the source and drain of the nMOS element.

16. The photodiode of claim 13, wherein a concentration of impurity of the P+ diffusion layer is approximately the same as a concentration of the same impurity as the source and drain of the pMOS element.

17. The photodiode of claim 13, wherein a metal component of at least one of the silicide layers is the same as a metal component of at least one of the silicide layers formed in the source and drain of the nMOS element and pMOS element.

18. The photodiode of claim 6, wherein the thickness of the semiconductor layer is 50 nanometers or less.

19. The photodiode of claim 13, wherein the dummy sidewalls have the same components as sidewalls of the nMOS element and pMOS element.

20. The photodiode of claim 6, wherein the device isolation layer includes silicon oxide formed within the semiconductor layer.

21. The photodiode of claim 6, wherein the third diffusion layer includes a P-type impurity.

22. The photodiode of claim 6, wherein the third diffusion layer includes an N-type impurity.

* * * * *